(12) United States Patent
Tamura (10) Patent No.: US 8,564,250 B2
(45) Date of Patent: Oct. 22, 2013

(54) CURRENT SENSOR

(75) Inventor: Manabu Tamura, Miyagi-Ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 452 days.

(21) Appl. No.: 13/026,127

(22) Filed: Feb. 11, 2011

(65) Prior Publication Data
US 2011/0221429 A1    Sep. 15, 2011

(30) Foreign Application Priority Data

Mar. 9, 2010    (JP) .................................. 2010-051790

(51) Int. Cl.
*H02J 7/04*    (2006.01)

(52) U.S. Cl.
USPC ......................................... 320/162; 324/260

(58) Field of Classification Search
USPC ....................................................... 320/162
See application file for complete search history.

(56) References Cited

U.S. PATENT DOCUMENTS 6,551,147 B2 *   4/2003   Wakata et al. ................. 439/754
8,125,214 B1 *   2/2012   Steingart et al. ........... 324/117 H

FOREIGN PATENT DOCUMENTS

JP         10-73619        3/1998
JP         2004-132790     4/2004

* cited by examiner

*Primary Examiner* — Bot Ledynh
(74) *Attorney, Agent, or Firm* — Beyer Law Group LLP (57) ABSTRACT

Disclosed is a current sensor including magnetic sensors disposed on a conductor having at least two separated current-carrying areas with different current magnitudes and detecting a magnetic field generated according to currents flowing through the conductor and a controller controlling outputs of the magnetic sensors, wherein the magnetic sensors are disposed in at least two respective areas having different current magnitudes and the controller switches outputs of the magnetic sensors.

6 Claims, 13 Drawing Sheets

CURRENT SENSOR

CLAIM OF PRIORITY

This application claims benefit of Japanese Patent Application No. 2010-051790 filed on Mar. 9, 2010, which is hereby incorporated by reference.

BACKGROUND OF THE INVENTION

1. Field of the Invention

The present invention relates to a current sensor which measures a magnitude of electric currents, and particularly, to a current sensor which detects currents flowing through a conductor through a electromagnetic conversion element.

2. Description of the Related Art

Recently, in the field of electric automobiles or solar cells, large output and high performance of automobiles and solar cell devices have been accomplished. The current value handled in the field has been enlarged accordingly, so a current sensor which contactlessly measures large direct currents is widely used. As such a current sensor, a sensor which includes a electromagnetic conversion element detecting currents, targets of detection, flowing through a conductor through the change of magnetic field around the conductor has been proposed. Also, as a current sensor, a current sensor having a wide measuring range has been developed.

As an example of the current sensor having a wide measuring range, there is a current sensor which can measure current values at places having a different intensity of the magnetic field caused by currents, by diposing two magnetic sensors at locations differing in distances from a conductor (Japanese Unexamined Patent Application Publication No. 2004-132790). In addition, there is a current sensor in which a portion shunting currents is provided in a conductor to minimize the magnetic field caused by the conductor so that the measuring range widens (Japanese Unexamined Patent Application Publication No. 10-73619).

However, since the current sensor in the JP-A 2004-132790 has a wide measuring range, the distance from the conductor needs to be increased, and as a result, a large space is required. Moreover, if the magnetic sensors are far away from the conductor, it is difficult to counteract differences in noise generated between the magnetic sensors. Also, the current sensor in JP-A 10-73619 has a problem in that, since the measuring range widens in response to current shunting, accuracy decreases in detecting minute electric currents.

SUMMARY OF THE INVENTION

An advantage of some aspects of the invention is to provide a current sensor which has a wide current measuring range and can measure currents with high accuracy by reducing noise.

The current sensor according to an embodiment of the invention includes magnetic sensors disposed on a conductor having at least two separated current-carrying areas with different current magnitudes and detecting magnetic fields generated according to currents flowing through the conductor and a controller controlling outputs of the magnetic sensors, wherein the magnetic sensors are disposed in at least two respective areas having different current magnitudes and the controller switches outputs of the magnetic sensors.

In this configuration, the magnetic sensors are disposed on a conductor having at least two separated current-flowing areas with different current magnitudes, and the separated current-carrying areas become a measuring range. Therefore, it is possible to measure current magnitudes in different ranges according to the current-carrying area, and thereby to widen the current measuring range. Also, in this configuration, since the magnetic sensors are not so far away from the conductor, it is possible to measure currents by a miniaturized sensor.

In the current sensor according to an embodiment of the invention, it is preferable for the magnetic sensors to be respectively disposed in separated areas in the conductor.

In the current sensor according to an embodiment of the invention, it is preferable for the magnetic sensors to be respectively disposed in a separated area and an unseparated area.

In the configuration, it is possible to widen the range of currents to be measured without reducing sensitivity (accuracy).

In the current sensor according to an embodiment of the invention, it is preferable that the conductor has three separated current-carrying areas with different current magnitudes, and an intensity ratio of the magnetic field generated in the three separated current-carrying areas is 50:5:1. In such a configuration, it is possible to measure currents in the current areas where different steady currents are used.

In the current sensor according to an embodiment of the invention, it is preferable that, in the at least two current-carrying areas, a pair of magnetic sensors which are diametrically opposite to each other in a sensitivity axial direction are disposed in the conductor at outer positions being symmetrical with respect to the center of the conductor, and the controller removes a disturbance magnetic field from the outputs of the pair of magnetic sensors.

In the configuration, it is possible to measure currents with high accuracy since disturbance noise added to the magnetic sensor can be cancelled in the measurement.

A battery according to an embodiment of the invention includes a battery body having a current line, and the current sensor installed in the current line.

According to the current sensor of the above embodiment of the invention, since the current sensor includes magnetic sensors disposed on a conductor having at least two separated current-carrying areas with different current magnitudes and detecting a magnetic field generated according to currents flowing through the conductor and a controller controlling outputs of the magnetic sensors, wherein the magnetic sensors are disposed in at least two respective areas having different current magnitudes and the controller switches outputs of the magnetic sensors, it is possible to widen the current measuring range and reduce noise, and thereby currents can be measured with high accuracy.

BRIEF DESCRIPTION OF THE DRAWINGS

FIGS. 1A and 1B are views showing a current sensor according to Embodiment 1 of the invention.

FIGS. 4A and 4B are views illustrating disposition positions of magnetic sensors in a current sensor according to Embodiment 1 of the invention.

FIGS. 8A and 8B are views illustrating disposition positions of magnetic sensors in a current sensor according to Embodiment 2 of the invention.

DESCRIPTION OF THE PREFERRED EMBODIMENTS

Hereinbelow, embodiments of the invention will be described in detail with reference to accompanying drawings.

Embodiment 1

Figure 1A:
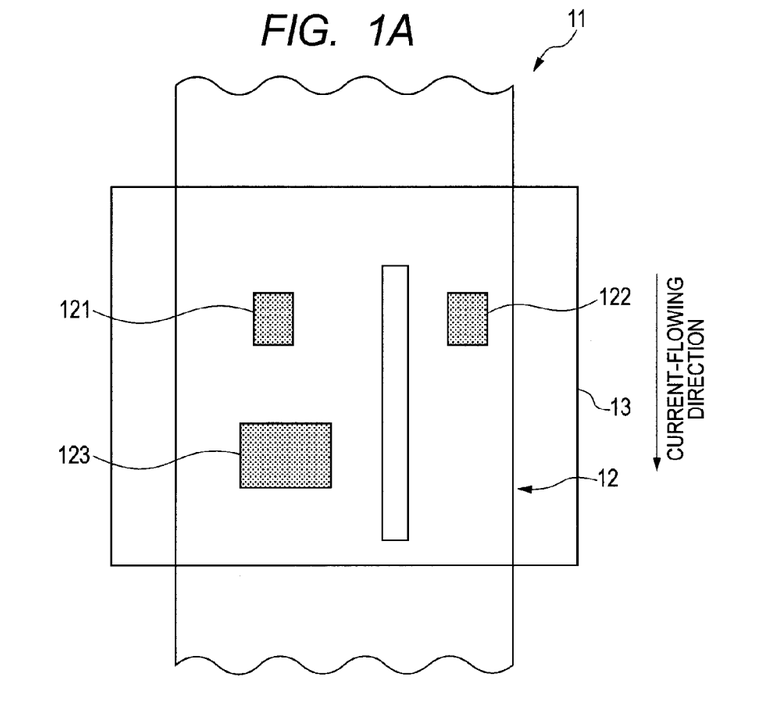
FIG. 1A is an internal perspective plan view.
Figure 1B:
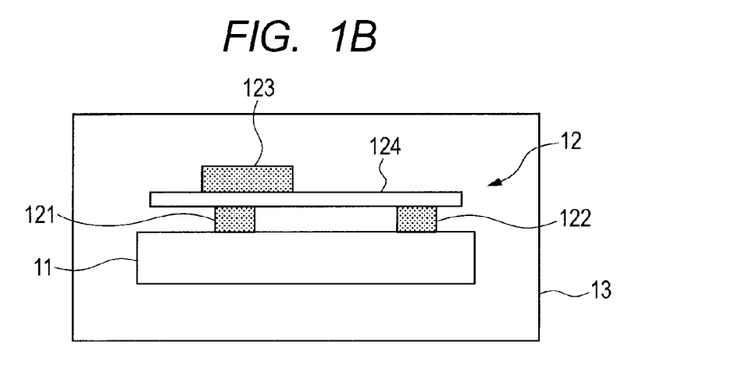
FIG. 1B is an internal perspective lateral view.

FIGS. 1A and 1B are views showing a current sensor according to Embodiment 1 of the invention. FIG. 1A is an internal perspective plan view, and FIG. 1B is an internal perspective lateral view.

Figure 2:
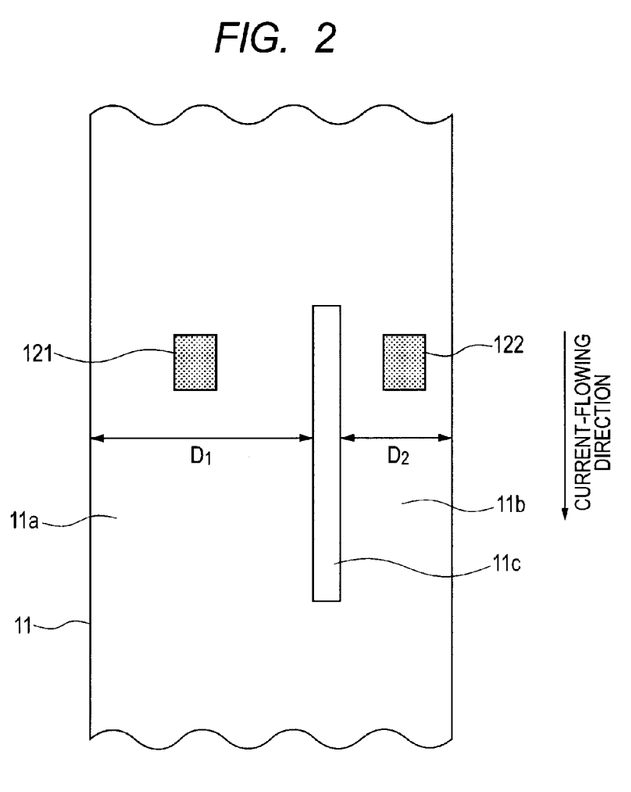
FIG. 2 is a view illustrating disposition positions of magnetic sensors in a current sensor according to Embodiment 1 of the invention.

As shown in FIG. 1A, near a conductor 11 as a current line through which currents flow, a current sensor 12 is disposed. The conductor 11 has at least two separated current-carrying areas with different current magnitudes as shown in FIG. 1A. Herein, as shown in FIG. 2, the conductor 11 is provided with a slit 11 and includes an area 11a having a wide conductor width (length in an orthogonal direction to a current-carrying direction) D1 and an area 11b having a narrow conductor width D2. The current sensor 12 is disposed such that a first magnetic sensor 121 is positioned on the area 11a of the conductor 11 and a second magnetic sensor 122 is positioned on the area 11b of the conductor 11. The current sensor 12 is electrically connected to a first magnetic sensor 121 disposed on the area 11a, a second magnetic sensor 122 disposed on the area 11b, and a first magnetic sensor 121 and a second magnetic sensor 122. The current sensor 12 includes a signal processing element 123 which is a controller controlling outputs of a first magnetic sensor 121 and a second magnetic sensor 122. A first magnetic sensor 121 and a second magnetic sensor 122 respectively detect magnetic fields generated according to currents flowing through the conductor 11.

As shown in FIG. 1B, in the current sensor 12, a first magnetic sensor 121 and a second magnetic sensor 122 are mounted on one side of the main surface of a substrate 124, and the signal processing element 123 is formed on the other side of the main surface of the substrate 124. The type of mounting of the magnetic sensors 121, 122 and the signal processing element 123 on the substrate 124 is not limited to FIG. 1B. The current sensor 12 is disposed on the conductor 11 such that a first magnetic sensor 121 is positioned on the area 11a of the conductor 11, and a second magnetic sensor 122 is positioned on the area 11b of the conductor 11. The magnetic sensors and the conductor 11 are integrated by a case 13. The case 13 may be constituted by resin molding or enclosing the conductor 11 with a pair of housings.

As shown in the disposition position of the magnetic sensors in FIG. 2, the magnetic sensors 121 and 122 are respectively disposed in separated areas in the conductor. In this case, a first magnetic sensor 121 measures the amount of currents flowing through the area 11a having a wide width D1 of the separated area in the conductor 11, and a second magnetic sensor 122 measures the amount of currents flowing through the area 11b having a narrow width D2 of the separated area in the conductor 11.

Figure 3:
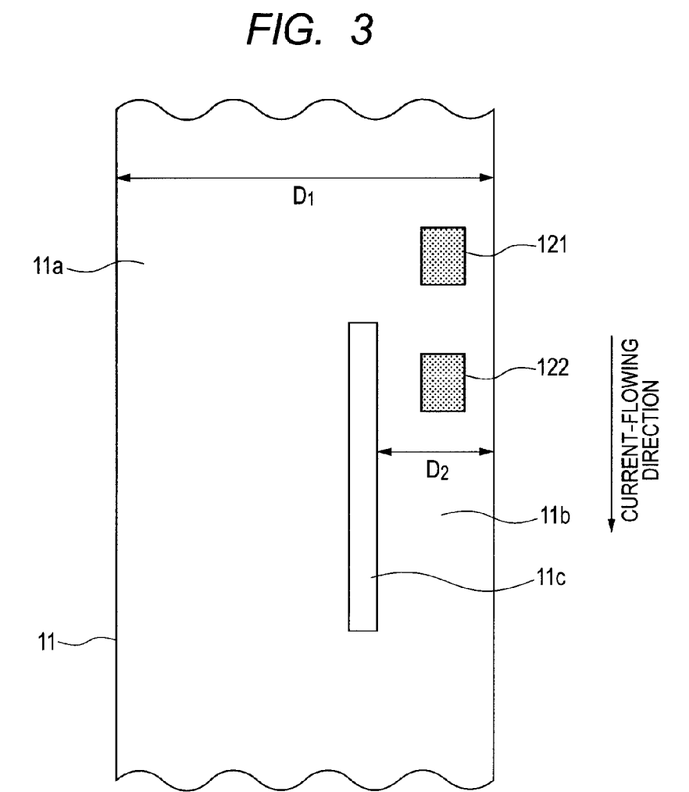
FIG. 3 is a view illustrating disposition positions of magnetic sensors in a current sensor according to Embodiment 1 of the invention.

In the invention, as shown in FIG. 3, the magnetic sensors 121 and 122 may be respectively disposed in the separated area and in the unseparated area of the conductor. In this case, a first magnetic sensor 121 measures the amount of currents flowing through the area 11a having the wide width D1 (entire width of conductor 11) of the unseparated area in the conductor 11, and a second magnetic sensor 122 measures the amount of currents flowing through the area 11b having the narrow width D2 of the separated area in the conductor 11.

In the configuration shown in FIGS. 2 and 3, it is possible to widen the measuring range of currents to be measured without decreasing sensitivity (accuracy).

Figure 4A:
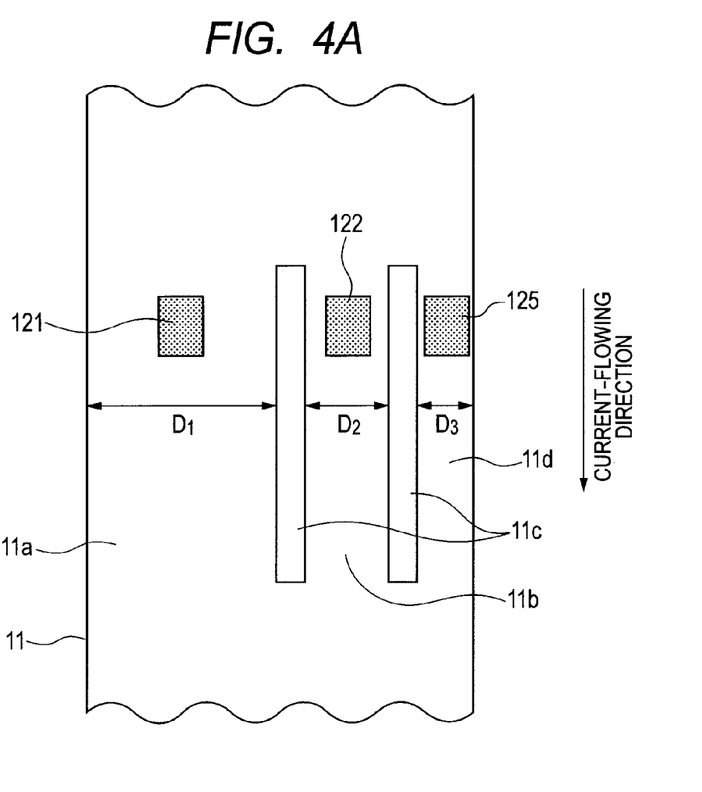
FIG. 4A is a plan view.

As shown in FIG. 4A, in the invention, the conductor may also be separated into three or more (three in FIGS. 4A and 4B) areas, and the magnetic sensors may be respectively disposed in the separated areas. That is, in the current sensor shown in FIG. 4A, a first magnetic sensor 121 is disposed in the area 11a having the widest width D1 of the separated area in the conductor 11 and measures the amount of currents flowing through the area 11a, a second magnetic sensor 122 is disposed in the area 11b having the second widest width D2 of the separated area in the conductor 11 and measures the amount of currents flowing through the area 11b, and a third magnetic sensor 125 is disposed in an area 11d having the narrowest width D3 of the separated area in the conductor 11 and measures the amount of currents flowing through the area 11d.

Figure 4B:
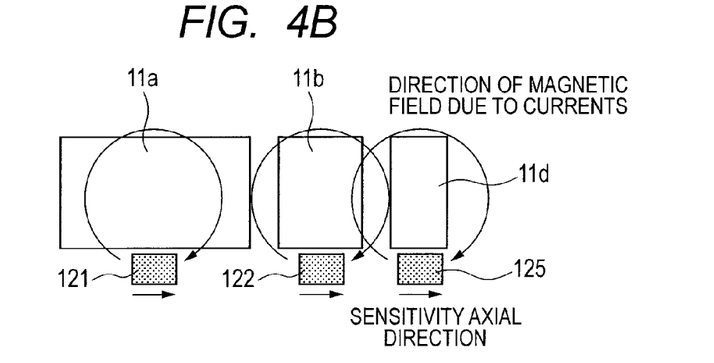
FIG. 4B is a lateral view.

For example, as shown in FIGS. 4A and 4B, the conductor 11 includes three separated current-carrying areas 11a, 11b, and 11d with different current magnitudes. The respective widths of the current-carrying area D1, D2, and D3 are properly set in response to magnetic fields added to the magnetic sensors, according to current areas where different steady currents are used. For instance, the widths D1, D2, and D3 of the current-carrying areas 11a, 11b, and 11d are set such that the ratio of magnetic fields added to the magnetic sensors 121, 122, and 125 becomes, for example, 50:5:1. The magnetic sensors 121, 122, and 125 are respectively disposed in the areas 11a, 11b, and 11d.

In the area 11a to which 50 of magnetic field is added in terms of the ratio, currents up to 20 A are detected, for example. In the area 11b to which 5 of magnetic field is added in terms of the ratio, currents from 20 A to 200 A are detected. In the area 11d to which 1 of magnetic field is added in terms of the ratio, currents from 200 A to 1000 A are detected. In this manner, for example, when the current sensor according to an embodiment of the invention is used in a battery, it is possible to detect currents without decreasing accuracy in all areas including the area 11a where the battery is almost not used, the area 11b where it is used steadily, and the area 11d where load is maximized instantaneously; therefore, the accuracy in managing the remaining battery power is improved.

As the magnetic sensors 121, 122, and 125, it is possible to use, for example, a magnetoresistance effect element (GMR element (Giant Magneto Resistance effect element)), a TMR element (Tunnel Magneto Resistance effect element), a AMR element (Anisotropic Magneto Resistance effect element), and a Hall element. Also, as shown in FIG. 4B, the magnetic sensors 121, 122, and 125 are provided so that the sensitivity axial direction becomes identical. The same configuration is applied to FIGS. 2 and 3.

Figure 5:
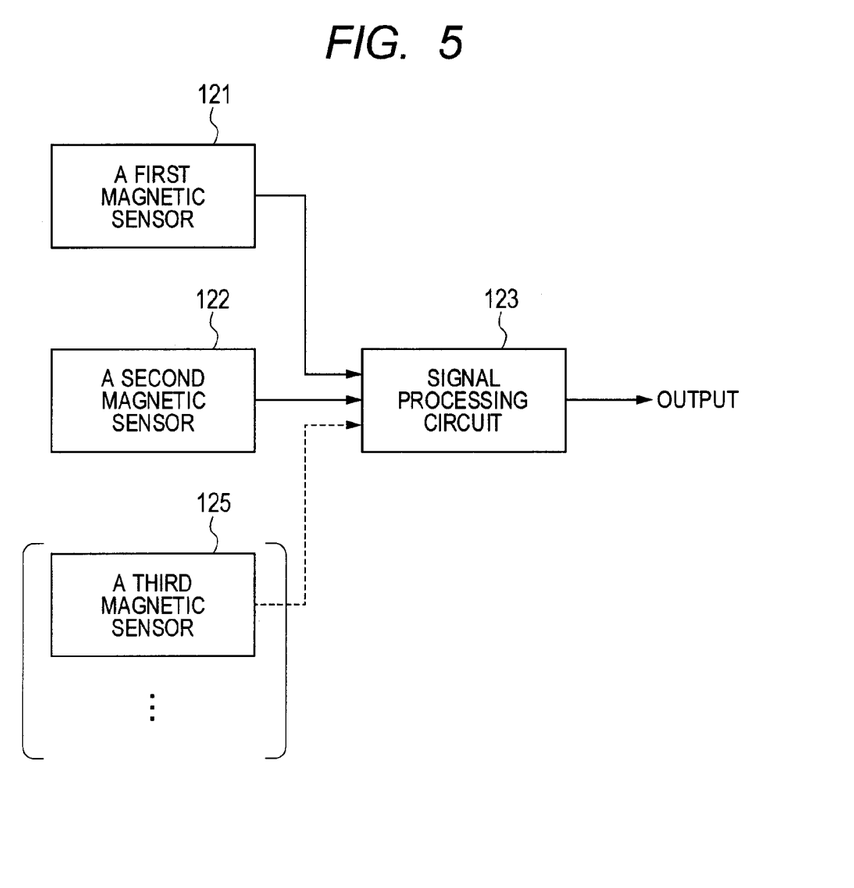
FIG. 5 is a view illustrating switching control in a current sensor according to Embodiment 1 of the invention.

FIG. 5 is a block diagram of the current sensor according to Embodiment 1 of the invention. The signal processing circuit (signal processing element) 123 shown in FIG. 5 switches the outputs of magnetic sensors respectively disposed in at least two areas with different ampacities.

In the configuration shown in FIGS. 2 and 3, the outputs of a first magnetic sensor 121 and a second magnetic sensor 122 are transmitted to signal processing circuit 123, and the signal processing circuit 123 switches the outputs of a first magnetic sensor 121 and a second magnetic sensor 122 and outputs signals corresponding to the currents. In the case shown in FIGS. 2 and 3, when the currents to be measured are small, the signals corresponding to currents are output by the output of a first magnetic sensor 121. When the currents to be measured are large, the final signal is output using the output of a second magnetic sensor 122.

In the configuration shown in FIGS. 4A and 4B, the outputs of a first magnetic sensor 121, a second magnetic sensor 122, and a third magnetic sensor 125 are transmitted to the signal processing circuit 123, and the signal processing circuit 123 switches the outputs of a first magnetic sensor 121, a second magnetic sensor 122, and a third magnetic sensor 125 and outputs signals corresponding to the currents. In the case shown in FIGS. 4A and 4B, when the currents to be measured are small, the signals corresponding to currents are output by the output of a first magnetic sensor 121. When the currents to be measured are large, the final signal is output using the outputs of a second magnetic sensor 122 and a third magnetic sensor 125.

Figure 6:
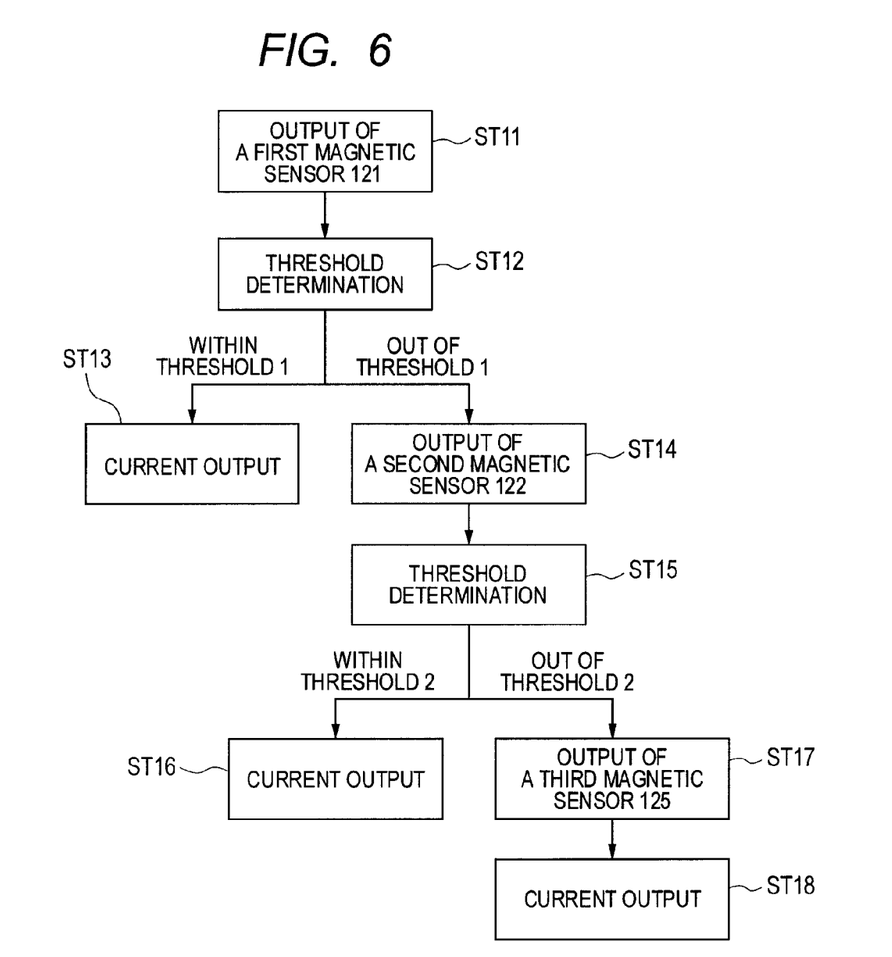
FIG. 6 is a flow chart illustrating a procedure of switching outputs of magnetic sensors in a signal processing circuit of a current sensor according to Embodiment 1 of the invention.

FIG. 6 is a flow chart showing a procedure of switching outputs of magnetic sensors in the signal processing circuit 123. Herein, the controlling procedure of the configuration shown in FIGS. 4A and 4B, in other words, the controlling procedure of the configuration in which the conductor 11 is separated into three areas having different widths and the magnetic sensors 121, 122, and 125 are disposed in the respective areas will be described.

In the signal processing circuit 123, a threshold 1 for switching the output of a first magnetic sensor 121 to the output of a second magnetic sensor 122, and a threshold 2 for switching the output of a second magnetic sensor 122 to the output of a third magnetic sensor 125, are set in advance. The current output detected when currents to be measured flow through the conductor 11 is transmitted to the signal processing circuit 123 from a first magnetic sensor 121, a second magnetic sensor 122, and a third magnetic sensor 125. The signal processing circuit 123 then determines the threshold with respect to the current output and switches any of the outputs of magnetic sensors to generate a final output.

When the currents to be measured are small, the output of a first magnetic sensor 121 becomes the final signal (current output) (ST 11). When the currents to be measured are large, the sensor output of a first magnetic sensor 121 increases accordingly. The threshold is determined with respect to the sensor output of a first magnetic sensor 121 (ST 12), and when the threshold is within the threshold 1, the sensor output of a first magnetic sensor 121 becomes the final signal (current output) (ST 13). When the threshold is outside of the threshold 1, the sensor output of a second magnetic sensor 122 measuring currents in a higher range compared to a first magnetic sensor 121 becomes the final signal (current output) (ST 14).

When the currents to be measured further increase, the sensor output of a second magnetic sensor 122 also increases accordingly. The threshold is determined with respect to the sensor output of a second magnetic sensor 122 (ST 15), and when the threshold is bigger than the threshold 1 and smaller than the threshold 2, the sensor output of a second magnetic sensor 122 becomes the final signal (current output) (ST 16); also, when the threshold is bigger than the threshold 2, the sensor output of a third magnetic sensor 125 measuring currents in a higher range compared to a second magnetic sensor 122 becomes the final signal (current output) (ST 17 and ST 18).

Figure 7:
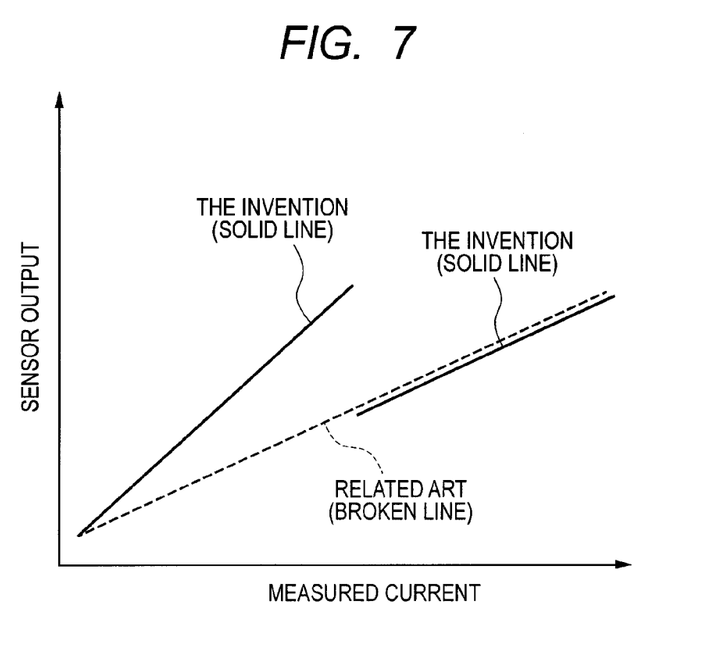
FIG. 7 is a view showing a relation between currents to be measured and sensor outputs.

Next, an embodiment made to clarify the effect of the invention will be described. As shown in FIG. 2, a current sensor in which the conductor 11 was separated into two current-carrying areas 11a and 11b, and a first magnetic sensor 121 and a second magnetic sensor 122 were disposed respectively in the areas was prepared. Using this sensor, sensor outputs were investigated while changing currents to be measured from 0 A to 500 A. The results are shown in FIG. 7. In addition, for comparison, a current sensor in which magnetic sensors were disposed in an unseparated conductor was prepared, and sensor outputs were similarly investigated while changing currents to be measured from 0 A to 500 A. The results are also shown in FIG. 7. As shown in FIG. 7, using the current sensor according to an embodiment of the invention made it possible to measure currents with further improved accuracy and high sensitivity of the sensor in a smaller range of currents to be measured.

Embodiment 2

Figure 8A:
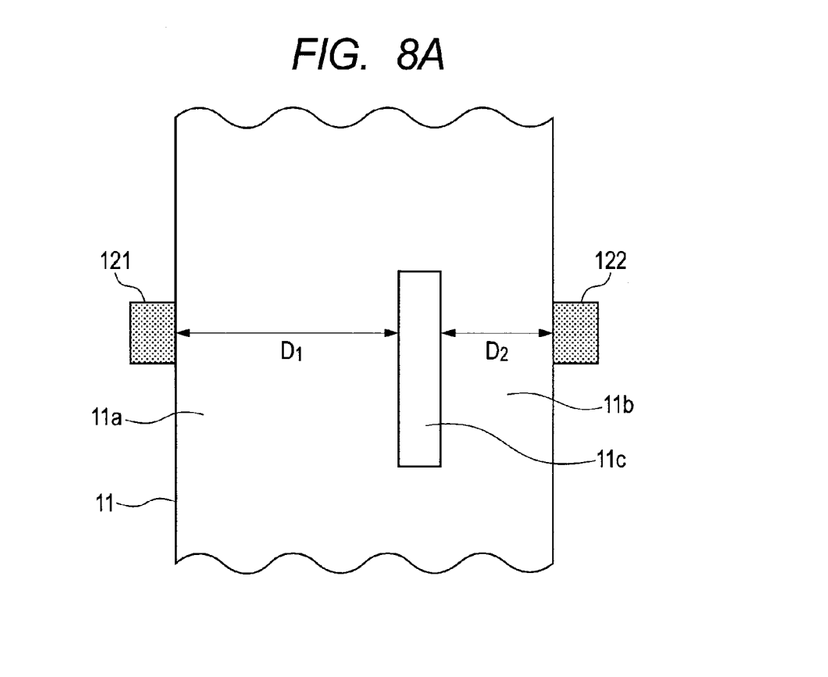
FIG. 8A is a plan view.
Figure 8B:
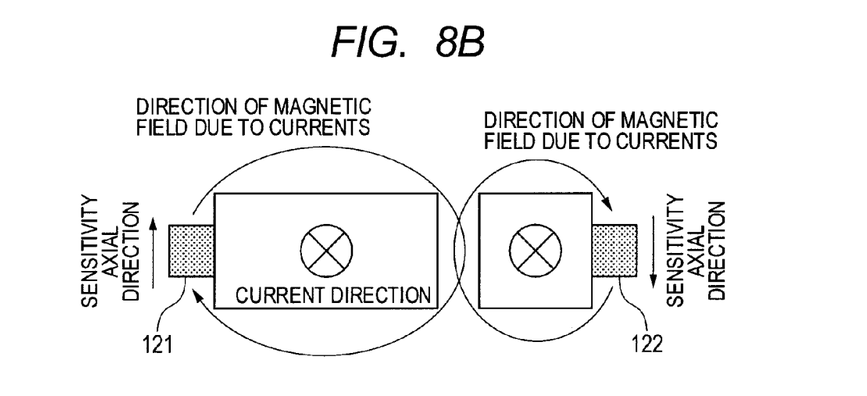
FIG. 8B is a lateral view.

FIGS. 8A and 8B are views illustrating disposition positions of magnetic sensors in a current sensor according to Embodiment 2 of the invention. FIG. 8A is a plan view, and FIG. 8B is a lateral view. In FIGS. 8A and 8B, portions the same as those in FIG. 2 are given the same signs to omit detailed descriptions.

In the current sensor shown in FIGS. 8A and 8B, in outer positions of the conductor 11, the positions being symmetrical with respect to the center of conductor 11, a first magnetic sensor 121 and a second magnetic sensor 122 are positioned respectively. In this manner, a first magnetic sensor 121 and a second magnetic sensor 122 are respectively disposed in separated areas 11a and 11b of the conductor 11. Also, as shown in FIG. 8B, a first magnetic sensor 121 and a second magnetic sensor 122 are disposed so that the two sensors have the diametrically opposite sensitivity axial direction.

Figure 9:
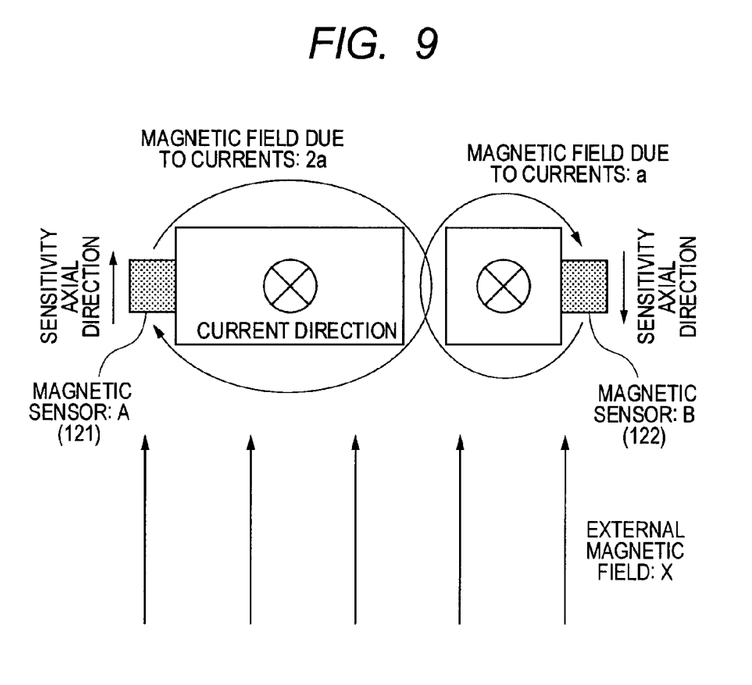
FIG. 9 is a view illustrating effects of a current sensor according to Embodiment 2 of the invention.

Herein, the conductor 11 is separated such that the ratio of the intensity of magnetic fields sensed by a first magnetic sensor 121 and the second magnetic sensor 122 becomes, for example, 1(D2):2(D1). In this case, as shown in FIG. 8B, the magnetic fields sensed by a first magnetic sensor 121 and a second magnetic sensor 122 are denoted by 2a and a respectively, and an external magnetic field is denoted by X. As shown in FIG. 9, a first magnetic sensor 121 detects the magnetic field due to currents and external magnetic field X, and a second magnetic sensor 122 detects the difference between the magnetic field due to currents and the external magnetic field X. As described above, since the intensity ratio of the magnetic field is A:B=2:1, it is possible to find the external magnetic field X by performing the following operation in the signal processing circuit 123. In addition, since the signal processing circuit 123 performs an operation for removing the external magnetic field X from the outputs of a first magnetic sensor 121 and a second magnetic sensor 122, the external magnetic field (noise) is removed from the outputs of magnetic sensors. As a result, the influence of magnetic field (noise) can be excluded from the output of magnetic sensors, and thereby currents can be measured with further improved accuracy.

$$2A-B=2(a+X)-(2a-X)=3X$$

$$\therefore X=(2A-B)/3$$

Subsequently, the embodiment made to clarify the effect of the invention will be described.

Figure 10:
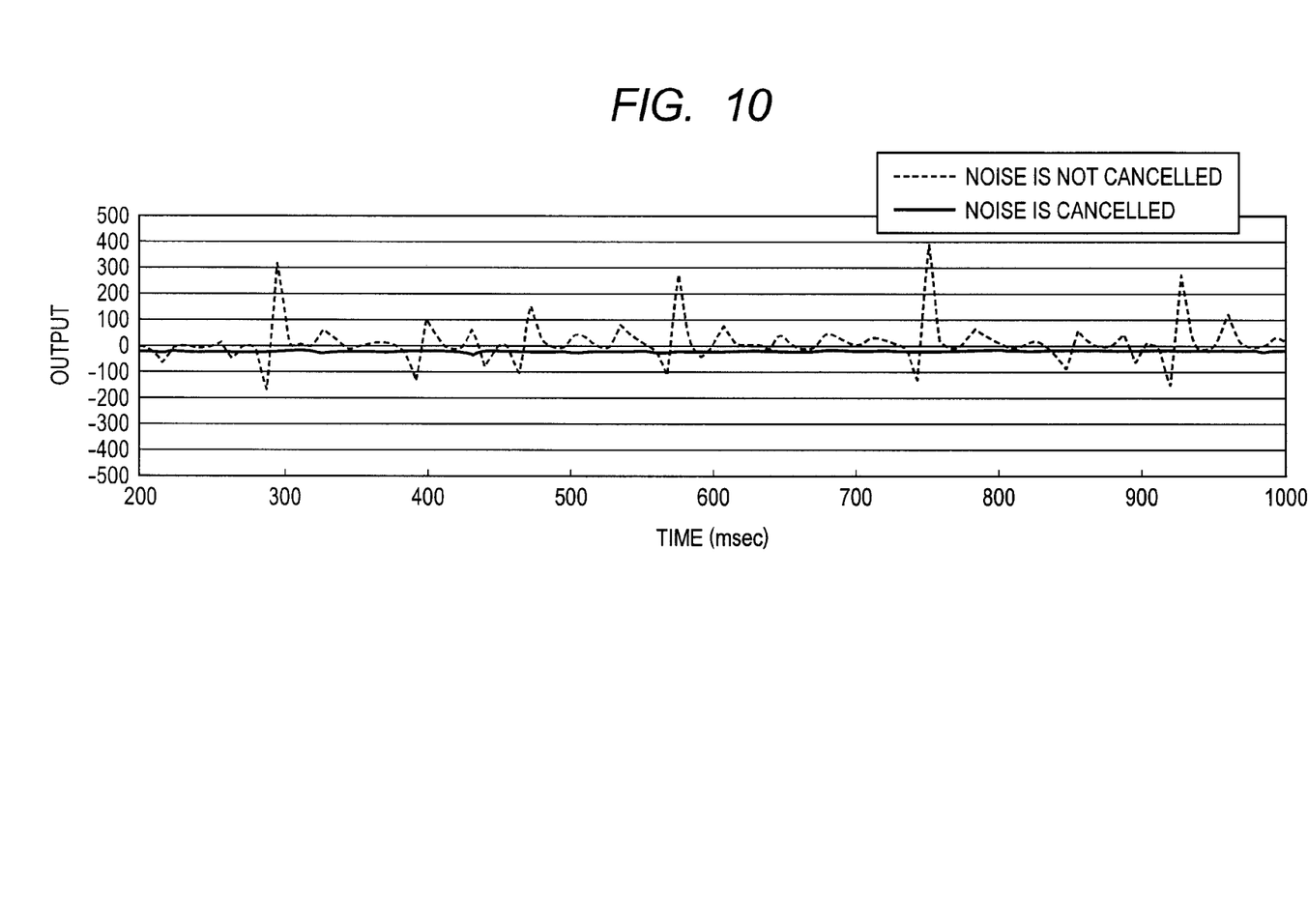
FIG. 10 is a view illustrating effects of a current sensor according to Embodiment 2 of the invention.

As shown in FIGS. 8A and 8B, a current sensor in which the conductor 11 was separated into two current-carrying areas 11a and 11b, and a first magnetic sensor 121 and a second magnetic sensor 122 were disposed respectively in the areas was prepared to investigate the change of sensor output over time. The results are shown in FIG. 10. Also, for comparison, a current sensor in which magnetic sensors were disposed in an unseparated conductor was prepared to similarly investigate the change of sensor output over time. The results are also shown in FIG. 10. As shown in FIG. 10, even when the disturbance magnetic field (noise) changed, a noise cancelling effect was confirmed in the configuration shown in FIGS. 8A and 8B. In this manner, since currents can be measured in the current sensor shown in FIGS. 8A and 8B with cancelling the disturbance noise added to the magnetic sensors, it is possible to measure currents with high accuracy.

Figure 11:
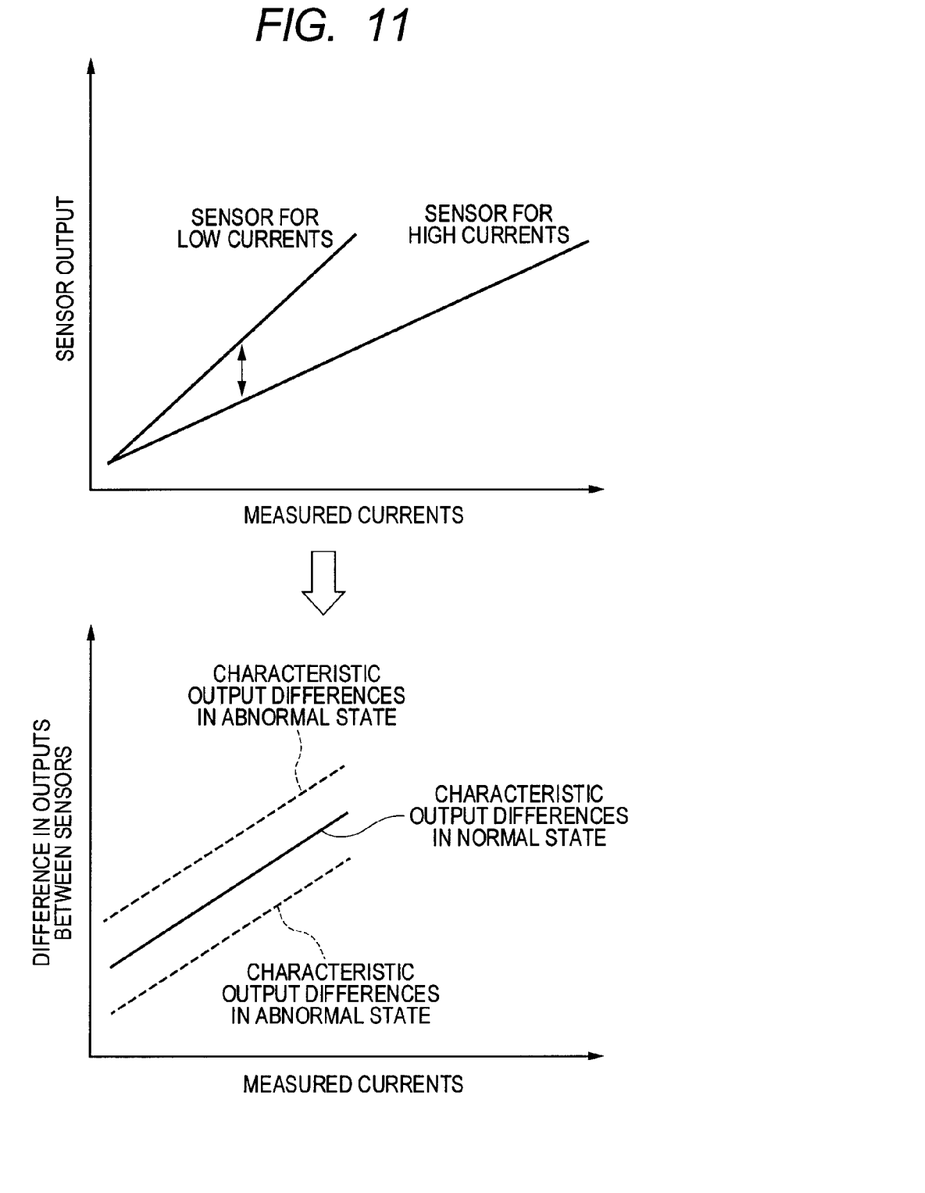
FIG. 11 is a view illustrating another example of a current sensor according to an embodiment of the invention.

As described above, in the current sensor according to an embodiment of the invention, current outputs of all the magnetic sensors detected when currents to be measured flow through the conductor 11 are transmitted to signal processing circuit 123. Therefore, it is possible to determine abnormal operations by using the outputs of magnetic sensors having different ranges of currents to be detected. As shown in FIG. 11, the output of the magnetic sensor for low currents (a first magnetic sensor 121 disposed in area 11a in FIG. 2) is more sensitive compared to the output of the magnetic sensor for high currents (a second magnetic sensor 122 disposed in area 11b in FIG. 2) (the magnetic sensor for low currents has a large slope in the sensor output with respect to currents to be measured). In this manner, since the magnetic sensors have different slopes in the sensor output with respect to currents to be measured, it is possible to determine abnormal operations by finding characteristic output differences through obtaining differences of output between two magnetic sensors. That is, as shown in FIG. 11, the characteristic output difference in a normal state (a solid line) is found in advance, and when an output difference largely deviated from the curve of the characteristic output difference in a normal state is obtained, it is determined as an abnormal operation.

In the current sensor having the configuration shown in FIGS. 2 to 4, when detection currents and outputs of individual magnetic sensors are small, the signal processing circuit 123 adds respective sensor outputs, and thereby detection currents can be found. By performing such a control, it is possible to widen the measuring range of currents and to further improve the sensitivity in the low current area.

In this manner, in the current sensor according to an embodiment of the invention, the magnetic sensors are disposed on the conductor including at least two separated current-carrying areas with different current magnitudes, and the separated current-carrying areas becomes the measuring range. Accordingly, it is possible to measure current magnitudes in different ranges according to the current-carrying area and to widen the current measuring range. Furthermore, in this configuration, since the magnetic sensor is not so far away from the conductor, it is possible to measure currents with the miniaturized sensor.

(Type of Use of Current Sensor)

The current sensor according to an embodiment of the invention can be applied to current sensors for detecting currents of the battery used in electric automobiles or solar cells. The battery has a configuration including a battery main body and the above sensor installed in the current line.

Now, a case of managing a battery by using the sensor for controlling charge and discharge of a battery will be described.

Figure 12:
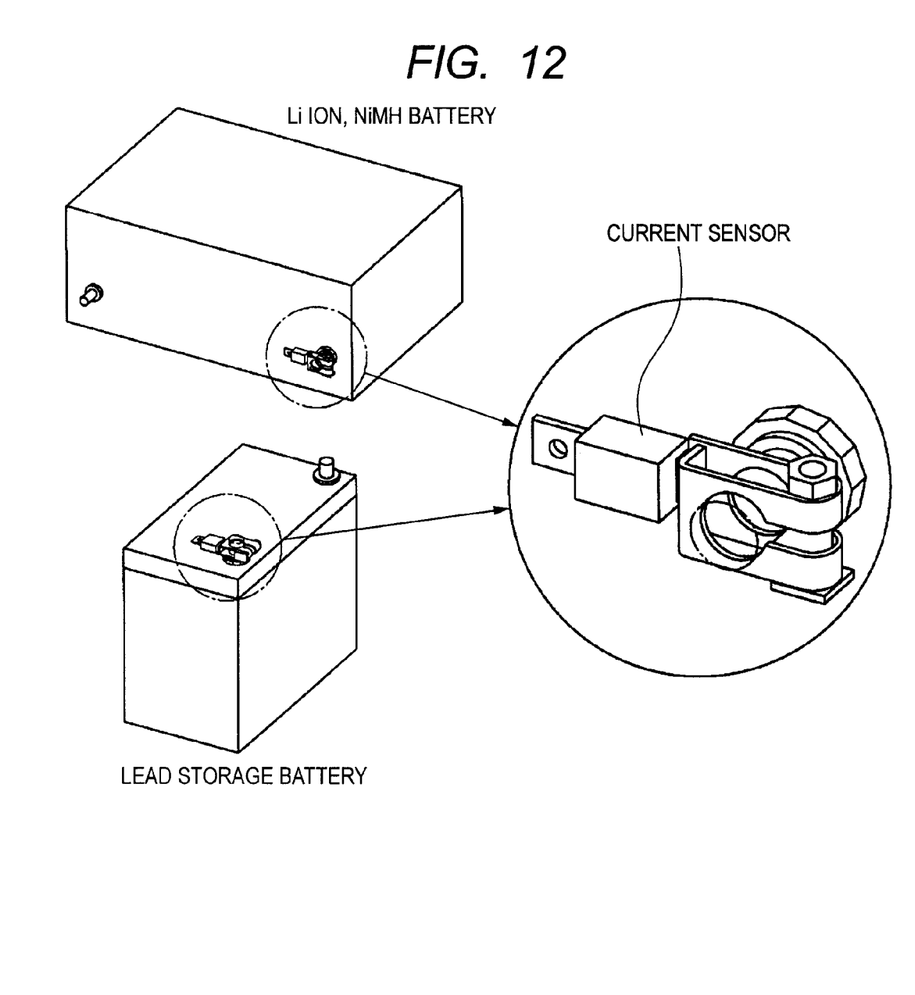
FIG. 12 is a view showing an example of use in which a current sensor according to an embodiment of the invention is applied to a battery.

The current sensor shown in the embodiment is provided on the anode or cathode of a battery and makes it possible to manage the battery. Specifically, as shown in FIG. 12, the current sensor is provided on the terminal of batteries performing charge and discharge, such as the Li-ion battery, the NiMH battery, and the lead storage battery. In addition to the current sensor, a sensor for detecting voltage and temperature is also provided to construct a more accurate battery management system. From the current value obtained through the current sensor and the measurement value of voltage, electric energy in use and the charge of the battery is calculated. Also, it is possible to correct the battery condition changed due to temperature change or electric energy. The current sensor is used for measuring and integrating currents upon charge and discharge of a battery, and thus makes it possible to manage the remaining battery power.

Figure 13:
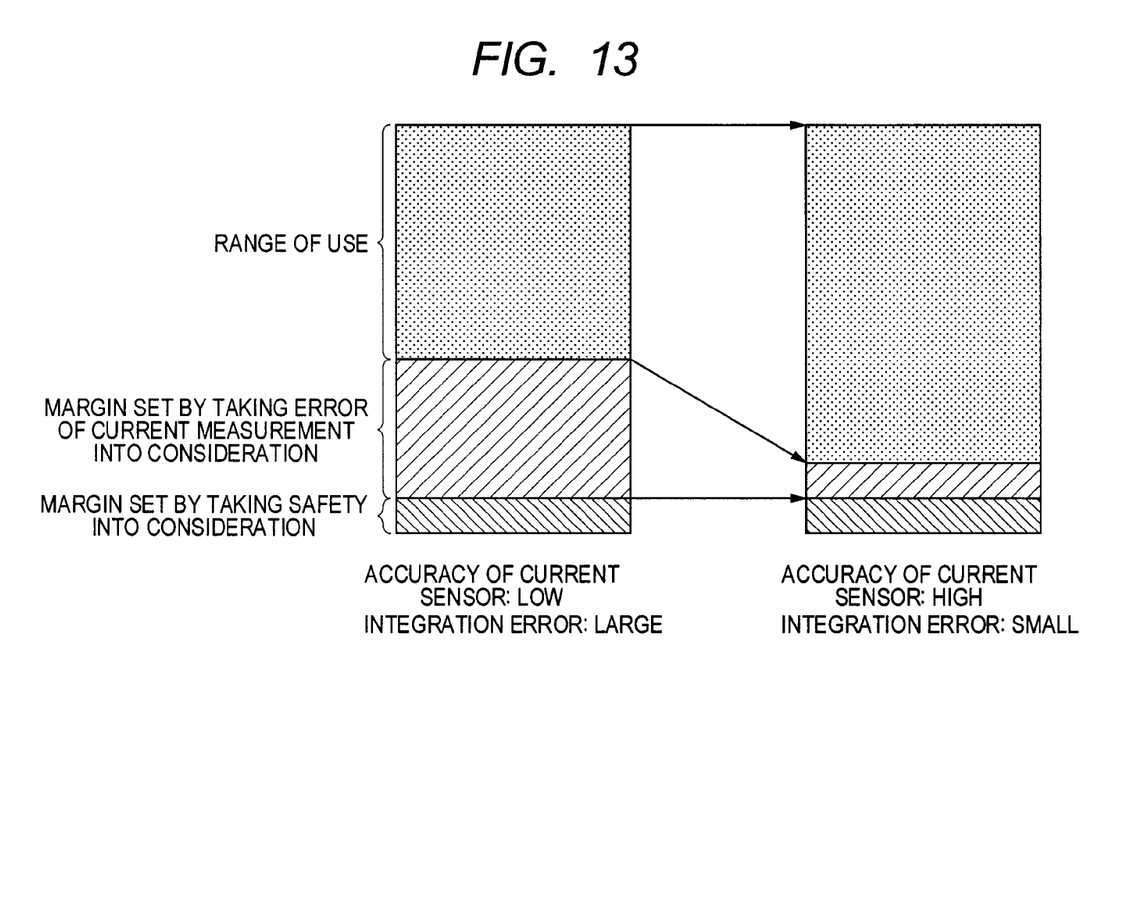
FIG. 13 is a view illustrating a use range of a battery when a current sensor according to an embodiment of the invention is applied to a battery.

There are big differences in current values between a case of using batteries and a case of not using batteries. However, using the current sensor shown in the embodiment makes it possible to detect current magnitudes at times of using and not using the battery by one sensor with high accuracy. Measuring the current value of a battery with high accuracy makes it possible to reduce the integration error; therefore, it is possible to reduce a margin set to a battery for overcharge and over discharge (refer to FIG. 13). As a result, it is possible to efficiently use a battery. For instance, when the current sensor shown in the embodiment is applied to batteries of electric automobiles, the mileage can be extended.

The invention is not limited to the embodiment and can be modified in various manners. For example, the embodiment mainly describes a case where a plurality of current-carrying areas is provided by providing slits in a conductor. However the invention is not limited to the case and also includes a configuration in which the size of current-carrying areas is changed, and current magnitudes in different ranges are measured according to the current-carrying areas. Also, disposition positions of components, materials, thickness, size, manufacturing methods, and the like in the embodiment can be properly modified. The invention can be properly modified within a scope which does not depart from the invention.

It should be understood by those skilled in the art that various modifications, combinations, sub-combinations and alterations may occur depending on design requirements and other factors insofar as they are within the scope of the appended claims of the equivalents thereof.

What is claimed is:

1. A current sensor comprising magnetic sensors disposed on a conductor having at least two separated current-carrying areas with different current magnitudes and detecting a magnetic field generated according to currents flowing through the conductor and a controller controlling outputs of the magnetic sensors, wherein the magnetic sensors are disposed in at least two respective areas having different current magnitudes and the controller switches outputs of the magnetic sensors.

2. The current sensor according to claim 1,
wherein the magnetic sensors are respectively disposed in separated areas in the conductor.

3. The current sensor according to claim 1,
wherein the magnetic sensors are respectively disposed in a separated area and an unseparated area in the conductor.

4. The current sensor according to claim 1,
wherein the conductor has three separated current-carrying areas with different ampacities, and an intensity ratio of the magnetic field generated in the three separated current-carrying areas is 50:5:1.

5. The current sensor according to claim 1,
wherein in the at least two current-carrying areas, a pair of magnetic sensors which are diametrically opposite to each other in a sensitivity axial direction are disposed in the conductor at outer positions being symmetrical with respect to the center of the conductor, and the controller removes a disturbance magnetic field from the output of the pair of magnetic sensors.

6. A battery comprising a battery body including a current line and the current sensor according to claim 1 installed in the current line.

\* \* \* \* \*